United States Patent
Kawase

(10) Patent No.: US 6,456,068 B1
(45) Date of Patent: Sep. 24, 2002

(54) MAGNETIC IMPEDANCE ELEMENT HAVING A HIGHLY LINEAR MAGNETIC FIELD DETECTION RANGE

(75) Inventor: Masahiro Kawase, Higashimatsuyama (JP)

(73) Assignee: Canon Denshi Kabushiki Kaisha, Saitama-ken (JP)

(*) Notice: Subject to any disclaimer, the term of this patent is extended or adjusted under 35 U.S.C. 154(b) by 0 days.

(21) Appl. No.: 09/687,498

(22) Filed: Oct. 16, 2000

(30) Foreign Application Priority Data

Oct. 22, 1999 (JP) .......................................... 11-301052

(51) Int. Cl.⁷ ............................................. G01R 33/02
(52) U.S. Cl. ...................................................... 324/249
(58) Field of Search ................................ 324/225, 244, 324/247, 249, 252, 260, 207.13, 207.25, 207.26, 174; 360/110; 33/355 R, 361, 363 R; 331/65

(56) References Cited

U.S. PATENT DOCUMENTS

| | | | | |
|---|---|---|---|---|
| 3,416,072 A | * | 12/1968 | Fussell et al. | ............... 324/249 |
| 3,619,772 A | * | 11/1971 | Ellis | ............................. 324/249 |
| 4,172,235 A | * | 10/1979 | Kohler | ........................ 324/249 |
| 4,635,152 A | * | 1/1987 | Iwasaki et al. | ............. 360/110 |
| 5,764,055 A | | 6/1998 | Kawase | ....................... 324/249 |
| 5,838,154 A | * | 11/1998 | Morikawa et al. | .......... 324/249 |

* cited by examiner

Primary Examiner—Edward Lefkowitz
Assistant Examiner—Reena Aurora
(74) Attorney, Agent, or Firm—Fitzpatrick, Cella, Harper & Scinto

(57) ABSTRACT

In a magnetic impedance element in which an element body is formed of a magnetic thin film formed on a non-magnetic substrate, and when a high-frequency current is supplied to the magnetic thin film, an impedance between both ends of the magnetic thin film changes in accordance with an external magnetic field, the magnetic thin film is formed in a slender zigzag pattern obtained by folding a straight line in parallel several times, and an easy axis of magnetization of the magnetic thin film is so set as to be directed along the longitudinal direction of the pattern. Also, assuming that a thickness of the magnetic thin film is T, a line width of the pattern is W, and a length of the pattern is L, T is in a range of 1 to 5 $\mu$m, and $L/(W \times T)$ is in a range of 10 to $400 \times 10^6$ m$^{-1}$.

2 Claims, 7 Drawing Sheets

MAGNETIC IMPEDANCE ELEMENT HAVING A HIGHLY LINEAR MAGNETIC FIELD DETECTION RANGE

BACKGROUND OF THE INVENTION

1. Field of the Invention

The present invention relates to a magnetic detection element that detects an external magnetic field, and more particularly to a magnetic impedance element (hereinafter referred to as "MI element") in which when a high-frequency current is supplied to an element body formed of a magnetic thin film, an impedance between both ends of the element body changes in accordance with an external magnetic field.

2. Related Background Art

In recent years, a magnetic detection element smaller in size and higher in sensitivity has been demanded as an information terminal device, a robot and so on using the magnetic detection element has been progressed. As the general detection element, there is a magneto resistancive element (hereinafter referred to as "MR element"). As the sensitivity of the MR element, a rate of change in the resistance according to the external magnetic field is about 3%, and the magnetic field detection sensitivity by only the MR element is to the degree that the presence/absence of the geomagnetism can be detected. In the recent MR elements, there has been developed a GMR element (giant magneto resistive element) large in the rate of change in the resistance. However, even in the GMR element, when the rate of change in the resistance is about 10%, although the magnetic field detection sensitivity per se is improved to about several times, the sensitivity cannot be enhanced extraordinarily.

Under the above circumstance, the present inventors have already proposed an MI element in which when a high-frequency current is supplied to an element body formed of a magnetic thin film, an impedance between both ends of the element body largely changes in accordance with an external magnetic field (U.S. Pat. No. 5,764,055). The MI element of this type is that the magnetic thin film of the element body is so structured as to change the permeability with respect to the external magnetic field, and the skin effect by supply of the high-frequency current is changed, to thereby change the impedance.

FIG. 10 shows an example of an MI element using a conventional magnetic thin film. In this example, a magnetic thin film 110 of the element body is formed on a glass substrate 112 in a slender zigzag pattern obtained by folding a straight line in parallel several times. A direction of magnetic field detection is directed to a longitudinal direction of the pattern of the magnetic thin film indicated by an arrow in the figure. An easy axis of magnetization of the magnetic thin film 110 is so set as to be directed along the widthwise direction of the zigzag pattern. Upon supply of a high-frequency current of MHz orders by electrodes 114a and 114b at both ends of the pattern of the magnetic thin film 110, an impedance between the electrodes 114a and 114b changes in accordance with the external magnetic field.

The magnetic impedance characteristic with respect to the external magnetic field is shown in FIG. 11, in which the impedance changes in the form of V when the external magnetic field is within about ±5 oersted. The sensitivity is extremely high at an inclined portion of the V-shape of the characteristic, where the sensitivity of several tens to several hundreds of the MR element is obtained. However, because the magnetic field detection range excellent in linearity is only about 3 oersted, it is limited to the application of a magnetic sensor narrow in the detection range.

SUMMARY OF THE INVENTION

The present invention has been made in view of the above circumstances, and therefore an object of the present invention is to provide an MI element in which an element body is formed of a magnetic thin film, (1) which is higher in the magnetic field detection sensitivity than an MR element and a GMR element, (2) which can take the same magnetic field detection range as that of a conventional MR element, and (3) which can obtain a stable sensitivity with a small element size (2 mm or less which is used as at least chip parts).

In order to solve the above problem, according to a first embodiment of the present invention, there is provided an MI element in which an element body is formed of a magnetic thin film formed on a non-magnetic substrate, and when a high-frequency current is supplied to said magnetic thin film, an impedance between both ends of said magnetic thin film changes in accordance with an external magnetic field, wherein said magnetic thin film is formed in a slender zigzag pattern obtained by folding a straight line in parallel several times, and an easy axis of magnetization of said magnetic thin film is so set as to be directed along the longitudinal direction of said pattern.

Also, according to the present invention, there is provided an MI element, wherein assuming that a thickness of said magnetic thin film is T, a line width of said pattern is W, and a length of said pattern is L, T is in a range of 1 to 5 $\mu$m, and L/(W×T) is in a range of 10 to 400×10$^6$ m$^{-1}$.

Other objects and features of the present invention will become apparent from the detailed description of the present invention with reference to the accompanying drawings.

DESCRIPTION OF THE PREFERRED EMBODIMENTS

Now, a description will be given in more detail of a preferred embodiment of the present invention with reference to the accompanying drawings.

Figure 1:
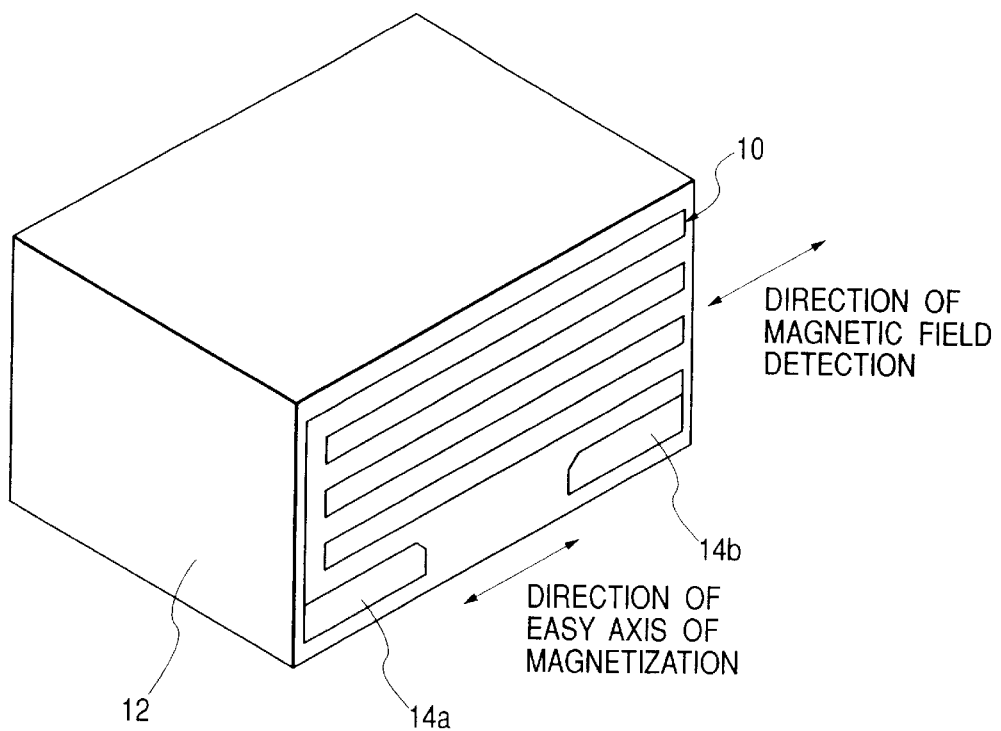
FIG. 1 is a perspective view showing the structure of an MI element in accordance with an embodiment of the present invention.

FIG. 1 is a perspective view showing the structure of an MI element in accordance with an embodiment of the present invention. As shown in the figure, a magnetic thin film 10 of an element body is formed on a non-magnetic substrate 12 made of glass or the like. The magnetic thin film 10 is formed of a high-permeability thin film 10 made of amorphous, permalloy, micro-crystal material or the like. As enlargedly shown in FIG. 2, the magnetic thin film 10 is formed in a slender zigzag pattern obtained by folding a straight line in parallel several times. Also, an easy axis of magnetization of the magnetic thin film 10 is so set as to be directed along the longitudinal direction of the zigzag pattern, and the longitudinal direction is identical with a magnetic field detection direction. Electrodes 14a and 14b are formed at both ends of the zigzag pattern of the magnetic thin film 10.

The operational principle of the MI element is that a change in the impedance between both ends of the magnetic thin film 10 is extracted as a change in the amplitude of a voltage, using a phenomenon that a high frequency current of MHz bands is supplied from the electrodes 14a and 14b at both ends of the magnetic thin film 10, and the permeability of the magnetic thin film 10 is changed with respect to the external magnetic field to change the skin depth of a current that flows in the magnetic thin film 10. A change in permeability with respect to the external magnetic field occurs depending on the B-H characteristic of the magnetic thin film 10.

The reasons that the magnetic thin film 10 is folded in a slender pattern several times are to largely ensure the resistance by an impedance value particularly and to obtain the effect of enhancing the sensitivity by reducing the demagnetizing field within the thin film (this effect will be described later).

Figure 3:
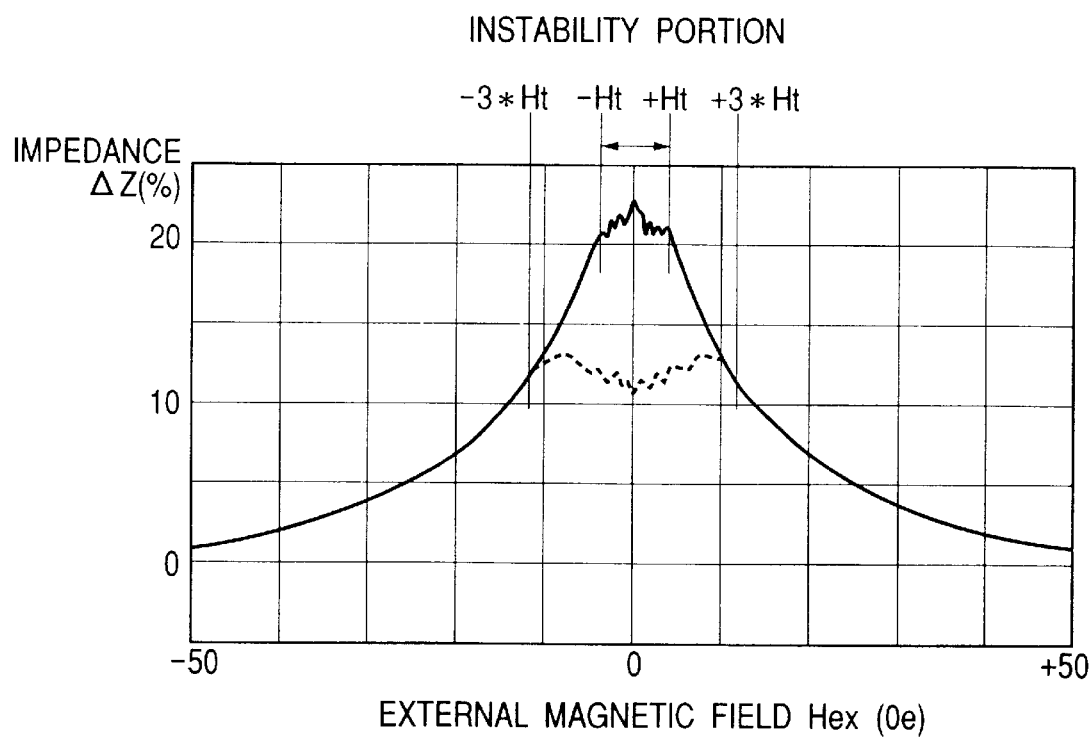
FIG. 3 is a graph showing an external magnetic field detection characteristic of the MI element.

If the easy axis of magnetization of the magnetic thin film 10 is not very accurately directed along the longitudinal direction of the zigzag pattern, a recess portion is produced in the peak of the external magnetic field detection characteristic (external magnetic field versus impedance change characteristic) as indicated by a broken line of FIG. 3. If the easy axis of magnetization of the magnetic thin film 10 is even slightly inclined with respect to the longitudinal direction of the zigzag pattern, the magnetic domain wall motion is braked by an influence of a rounding magnetic field developed by the high-frequency current which is directly supplied to the magnetic thin film 10. If the brake is large, the recess in the peak as described above is definitely produced, thereby making it difficult to deal with the element.

The easy axis of magnetization of the magnetic thin film 10 is controlled by applying a magnetic field to the longitudinal direction of the pattern of the magnetic thin film 10 during a film formation or a heat treatment.

The external magnetic field detection characteristic of the above structure becomes a mountain-type characteristic having a beautiful base with a plus peak as indicated by a solid line in FIG. 3. However, as a result of well observing the characteristic, it is found that the characteristic is out of order in the vicinity of the peak of the zero magnetic field, and a range of ± several Gauss cannot be used. The instability portion is not found in the MR element or the MI element in which the element body is made of amorphous wire, and the element body in this embodiment is considered as the inherent phenomenon of the MI element formed of the magnetic thin film.

It is predicted that the above phenomenon is influenced by the instability elements pertaining to the magnetic domain wall motion within the magnetic thin film, for example, the catch of the magnetic domain wall motion due to a physical defect within the magnetic thin film or a noise component due to the production or elimination of the magnetic domain wall of 90°.

Since it is very difficult to improve the instability element at that portion, a region outside of that portion is used for the operation of the element. However, since that region corresponds to a magnetization rotation or magnetization saturation region in which the magnetic domain wall motion is substantially completed, and obtains a stable inclined portion, if the operating point due to a bias magnetic field is set within a range of that portion, it is easy to deal with the element. The bias magnetic field is applied to the MI element by a permanent magnet or a coil not shown.

In setting the operating point due to the bias magnetic field, it has been found that assuming that the magnetic fields at change points on both ends of a plus side and a minus side of the characteristic instability portion which appears in the vicinity of the zero magnetic field on the external magnetic field detection characteristic shown in FIG. 3 are Ht and −Ht, if the operating point is set between the magnetic field Ht and 3Ht three times as large as the magnetic field Ht or between the magnetic field −Ht and −3Ht three times as large as the magnetic field −Ht, the detection relatively excellent in linearity and high in sensitivity can be conducted.

The characteristic of the MI element is determined by the magnetic characteristic of the magnetic thin film 10 and the dimensions of the pattern, and in order to ensure the characteristic while the size of the element is made small, an appropriate selection is required.

As qualitative demands, the following are important.

(1) The easy axis of magnetization of the magnetic thin film 10 is accurately directed along the longitudinal direction of the zigzag pattern, and the permeability is extremely high.

(2) Taking the demagnetizing field occurring in the longitudinal direction of the zigzag pattern into consideration, the length of the pattern is set to be relatively large with respect to the film thickness and the line width of the pattern.

Figure 2:
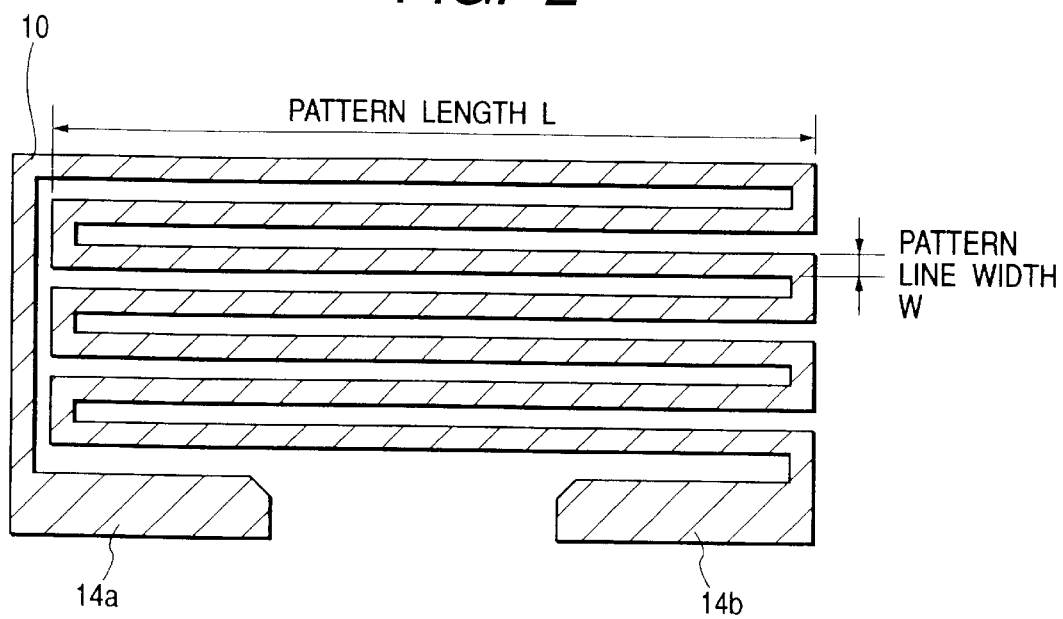
FIG. 2 is an enlarged view showing a zigzag pattern of a magnetic thin film which is a body of the MI element.

Hereinafter, a description will be given of the dimensional relationships of the thickness T of the magnetic thin film 10, the line width W of the zigzag pattern and the length L of the zigzag pattern which satisfy the above demand (2) and stably function with a high sensitivity in case that the MI element is short in length (particularly, 2 mm or less). The line width W and the length L of the pattern are shown in FIG. 2.

Figure 4:
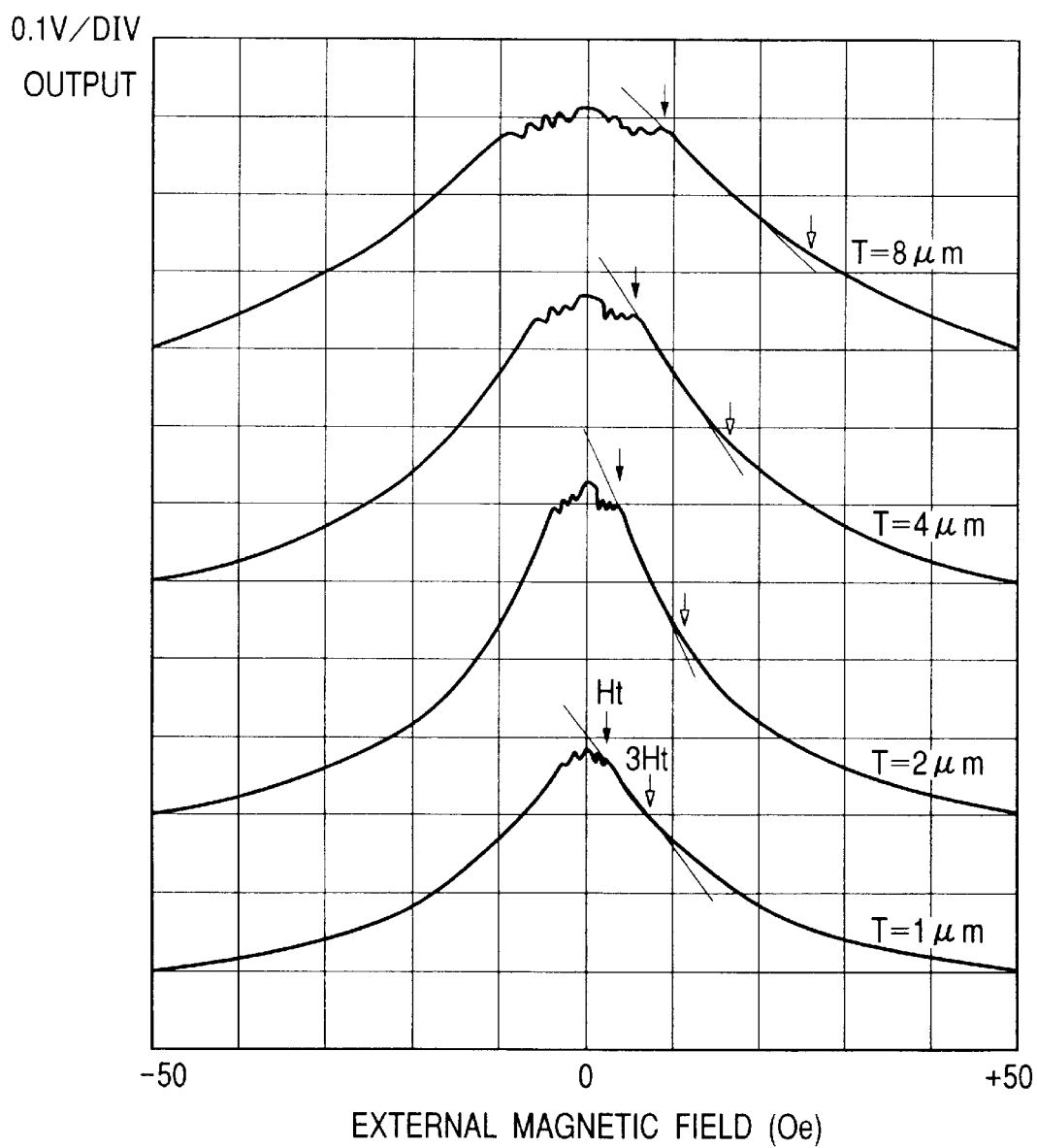
FIG. 4 is a graph showing the respective output characteristics of the MI element in the case where the thickness of a magnetic thin film is different.

First, the film thickness will be described. In the case where, in the structure shown in FIG. 1, the line width W of the zigzag pattern of the magnetic thin film 10 is fixed to 12 μm and the length L of the pattern is fixed to 1.4 mm, and the film thickness T is set to 1, 2, 4 and 8 μm, respectively, when a high-frequency current of 20 MHz is supplied to the element, the output data of the MI element with respect to the external magnetic field is shown in FIG. 4. The axis of ordinate in FIG. 4 represents the outputs which are appropriately shifted and indicated, respectively, so that the relative difference due to the film thickness T can be understood.

Figure 5:
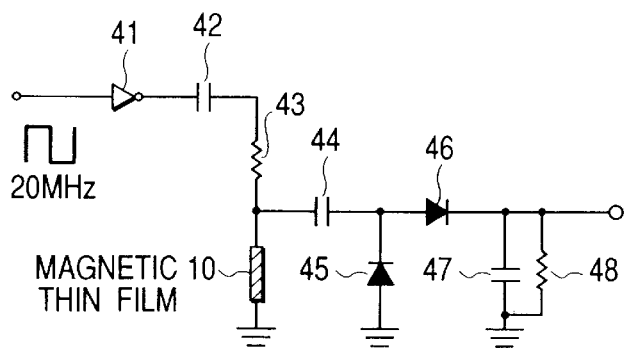
FIG. 5 is a circuit diagram showing a drive circuit used for the evaluation of the output characteristic of the MI element.

The evaluation of the output of the MI element in the figure is conducted by the structure of a circuit shown in FIG. 5. A high-frequency current due to a pulse oscillation signal of 20 MHz is supplied to the magnetic thin film 10 of the MI element through a buffer amplifier 41, a capacitor 42 and a resistor 43, and a change in amplitude voltage due to a change in an impedance between both ends of the magnetic thin film 10 responsive to the external magnetic field is detected by a detecting circuit made up of capacitors 44, 47, diodes 45, 46 and a resistor 48 and extracted to obtain an output.

As shown in FIG. 4, when the film thickness T is 2 μm, the most excellent characteristic is exhibited, and when the film thickness T is 1 μm, the skin effect is weakened and the peak of the characteristic is lowered. If the drive frequency of the MI element can be heightened or the permeability of the magnetic thin film 10 can be increased, the skin effect can be enhanced, and the deterioration of the sensitivity can be relieved to some degree. When the film thickness T is thick, that is, 4 and 8 μm, the skin effect is sufficient. However, since areas of magnetic poles developed at both ends of the detection direction increase, to thereby increase a demagnetizing field and reduce the magnetic field component within the magnetic thin film 10. As a result, the base of the mountain-type characteristic is expanded toward the right and left sides, and the inclination of the inclined portion which represents the sensitivity becomes gentle.

Figure 6:
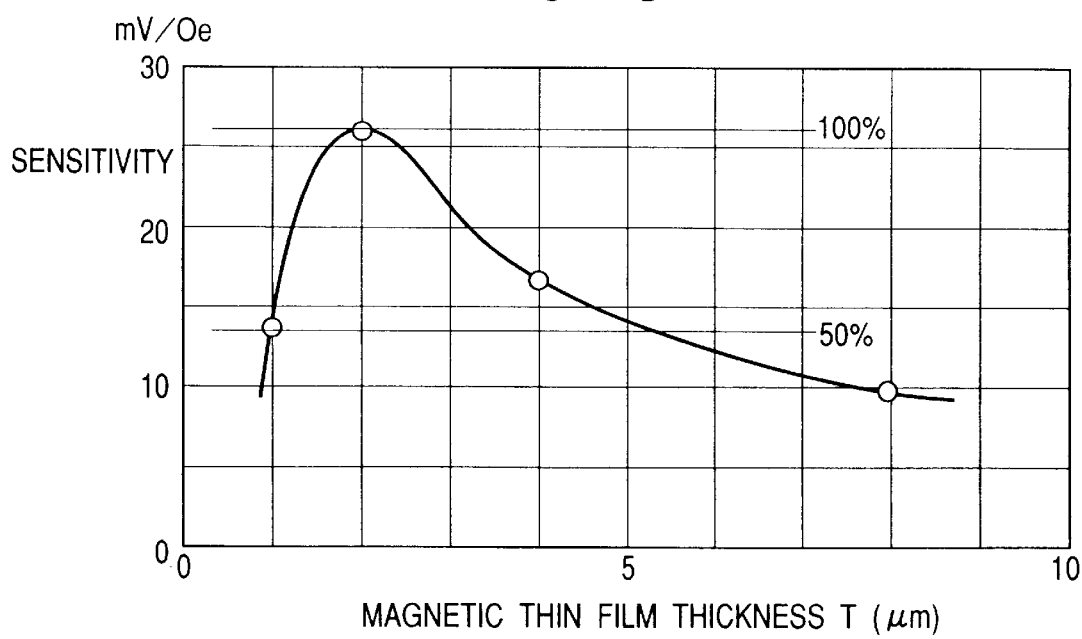
FIG. 6 is a graph showing a relationship between the sensitivity corresponding to an inclination between magnetic fields Ht to 3 Ht at a point of change of an end portion of the magnetic field detection instability portions in the respective characteristics in FIG. 4, and the film thickness.

Also, FIG. 6 is a graph showing a relationship between the sensitivity corresponding to an inclination between magnetic fields Ht to 3 Ht on the external magnetic field detection characteristic under the above respective conditions, and the film thickness T. Assuming that the sensitive value is 100% when the film thickness T is 2 μm, the sensitive values of 50 to 100% are easy to deal with, the film thickness of 1 to 5 μm is easy to deal with. From the above facts, the film thickness T is set to a range of 1 to 5 μm.

Figure 7:
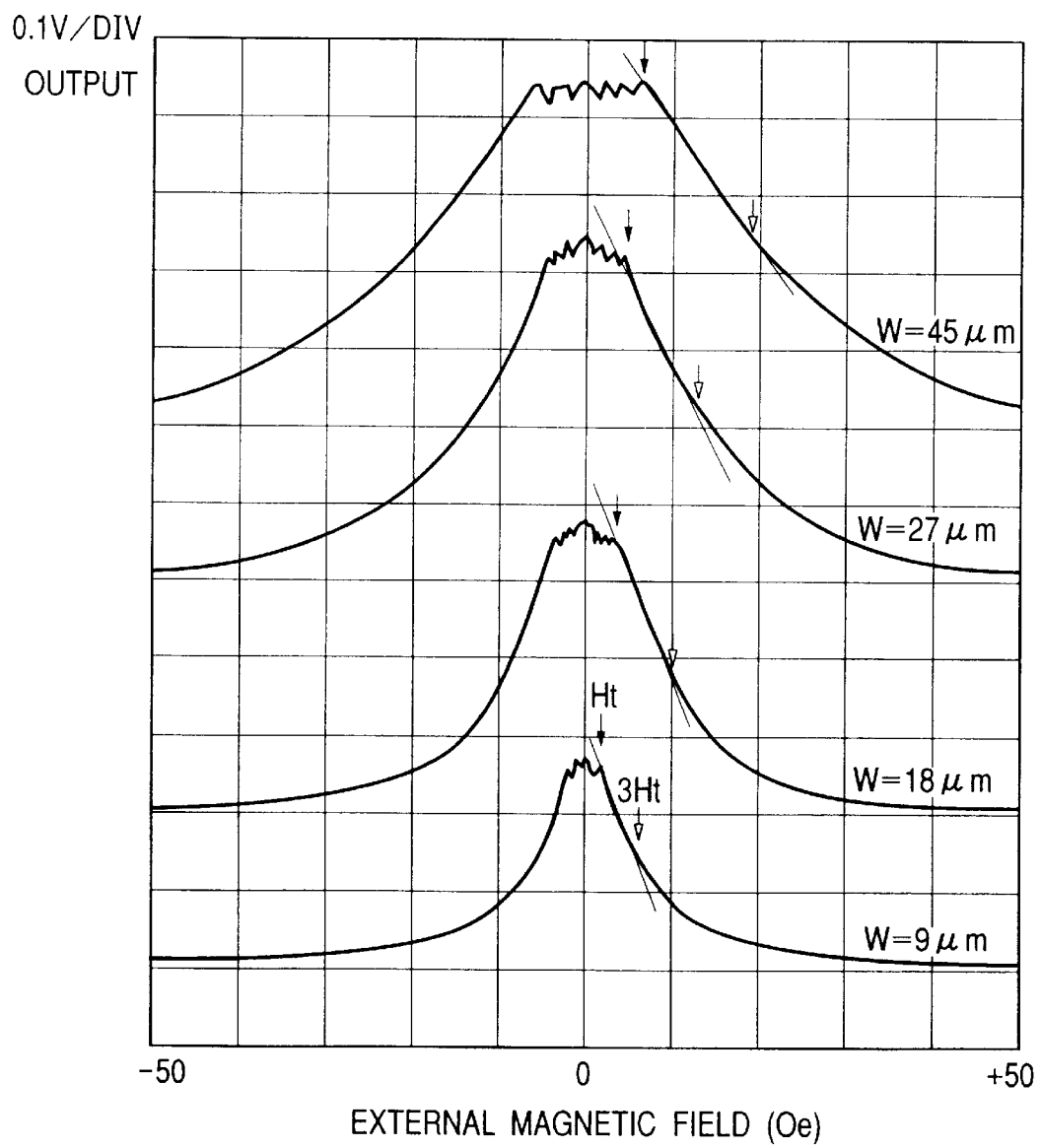
FIG. 7 is a graph showing the respective output characteristics of the MI element in the case where the zigzag pattern line width of the magnetic thin film is different.

Subsequently, in studying the relationship of the line width W of the zigzag pattern of the magnetic thin film 10 and the pattern length L, the respective output characteristics as a result that the length L of the pattern is fixed to 1.67 mm, the film thickness T is fixed to 2 μm, and the line width W of the pattern is set to 9, 18, 27 and 45 μm are shown in FIG. 7.

In this example, the characteristic difference depending on the demagnetizing field appears as in the above-described film thickness T, and since the demagnetizing field can be reduced more as the pattern line width W is narrower, the sensitivity is the highest when the line width W is 9 μm. It is presumed that the reason that the peak of the output characteristic is lowered more as the pattern line width W is narrower is because the permeability is deteriorated due to the residual stress within the magnetic thin film 10 by narrowing the pattern line width W.

Figure 8:
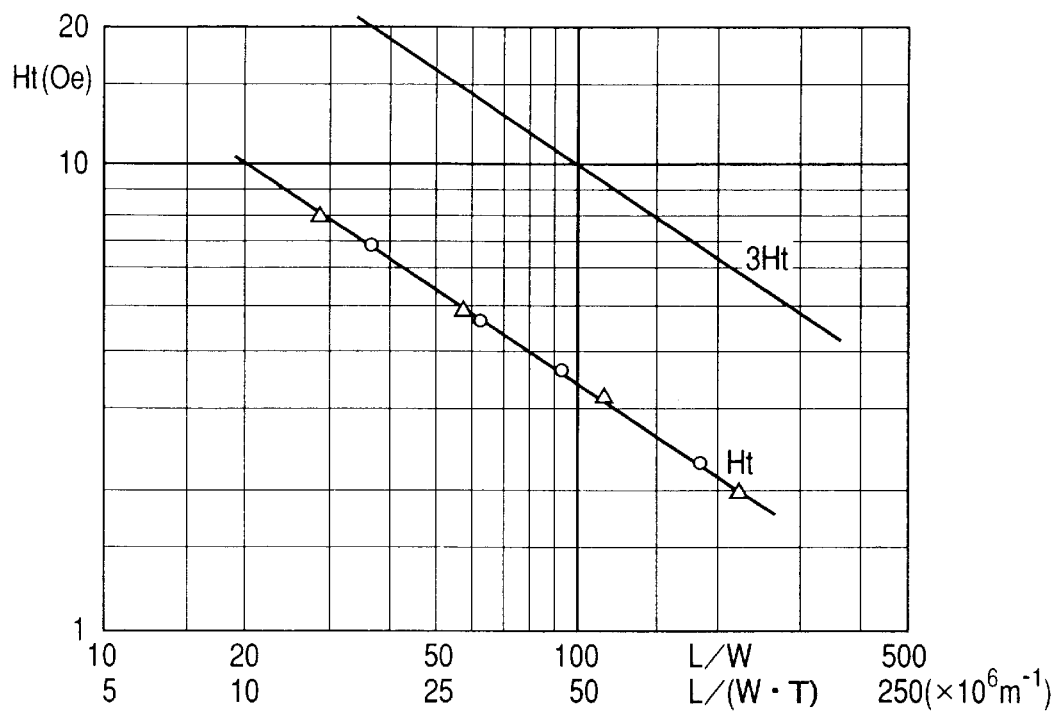
FIG. 8 is a graph showing the relationships between the length L/line width W or the length L/(line width W×film thickness T) of the zigzag pattern of the magnetic thin film and the above magnetic fields Ht and 3 Ht.

The influence of the demagnetizing field is well understood from the magnetic field Ht at the change point on the end of the instability portion of the respective characteristics. In FIG. 8, the axis of abscissa represents the pattern length L/pattern line width W, and the axis of ordinate represents the external magnetic field in a logarithmic axis indication, and the numeric values of the magnetic field Ht at the change point on the end of the instability portion of the characteristic under the respective conditions shown in FIG. 7 are plotted by O. As a result, it is found that Ht under the respective conditions are aligned in a line in both the logarithmic axis indications. That is, the characteristic is straightly changed with respect to the demagnetizing field pertaining to the length L/line width W. Also, if a line of 3Ht is inserted into the graph, how the magnitude of the magnetic field is set is simply readable when the operating point is in a range of Ht to 3Ht under a certain condition of the length L/line width W.

Figure 9:
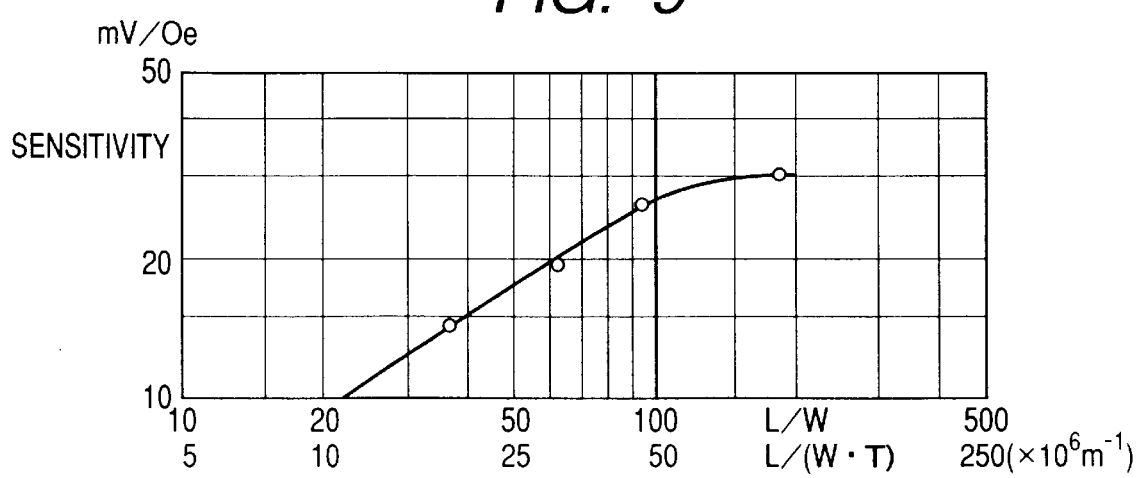
FIG. 9 is a graph showing the relationships between the above L/W or L/(W×T) and the sensitivity in the MI element.
Figure 10:
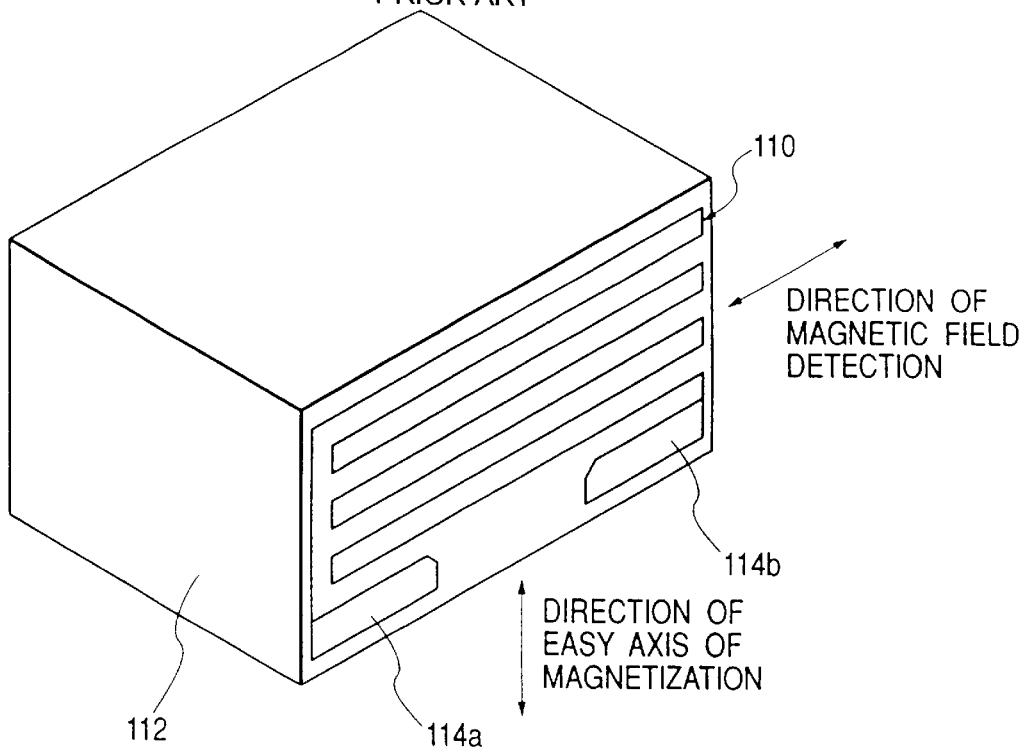
FIG. 10 is a perspective view showing the structure of a conventional MI element.
Figure 11:
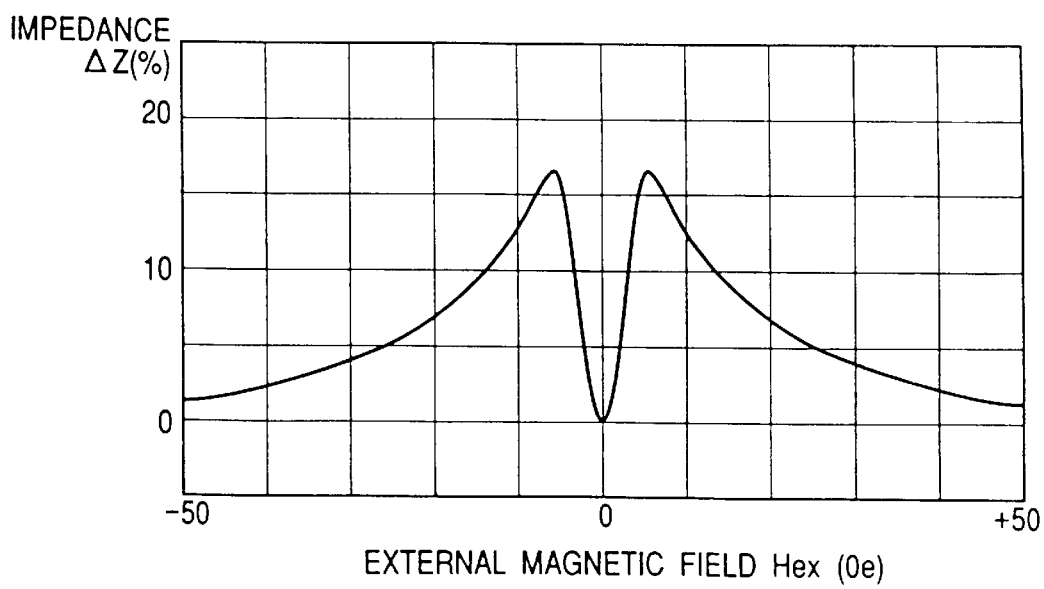
FIG. 11 is a graph showing the magnetic impedance characteristic of the MI element.

In addition, in the case where the magnetic field is found by the relationship of the length L, the line width W and the film thickness T, L/(W×T) obtained by dividing L/W by 2 μm of the film thickness T which is the prerequisite of L/W may be set in the axis of abscissa of FIG. 8. In fact, when data of the respective Ht is plotted by a mark Δ with respect to L/(W×T) from the data of FIG. 4 where the above thicknesses T of the magnetic thin film 10 are set, it is found that the numeric values are on the same line. (W×T) is a sectional area orthogonal to the longitudinal direction of one line of the zigzag pattern of the magnetic thin film 10.

Where should be used in the range from that data. When Ht exceeds 10 Oe, the sensitivity is deteriorated, and as shown in FIG. 9, at a point of L/(W×T) being $10 \times 10^6$ m$^{-1}$ where Ht becomes 10 Oe (refer to FIG. 8), Ht is lower than 10 mV/Oe, and the superior difference to the sensitivity of the MR element (several mV/Oe) hardly appears. Accordingly, the lower limit of L/(W ×T) is $10 \times 10^6$ m$^{-1}$ or more.

Also, the sensitivity is higher as the length L of the pattern is longer. However, when the length L is set to 2 mm or less in order to downsize the MI element, assuming that the limit of the pattern line width W which can obtain the stable magnetic characteristic is 5 μm and the film thickness T as required at the minimum is 1 μm, the upper limit is $400 \times 10^6$ m$^{-1}$ or less.

As a more preferable condition, when the film thickness T is about 2 μm and Ht is set to about 5 Oe or less, since it is easy that bias is effected by a coil, L/(W×T) may be preferably set to $28 \times 10^6$ m$^{-1}$ or more.

Also, as the upper limit, because the permeability of the magnetic thin film 10 is liable to be lowered due to a stress occurring between the magnetic thin film 10 and the nonmagnetic substrate 12, it is desirable to ensure the pattern line width W of 10 μm or more. As a result, the upper limit of L/(W×T) is desirably set to $100 \times 10^6$ m$^{-1}$ or less.

As described above, the thickness T of the magnetic thin film 10 is set to a range of 1 to 5 μm, and the length L/(pattern line width W×film thickness T) of the zigzag pattern is set to 10 to $400 \times 10^6$ m$^{-1}$, more preferably 28 to $100 \times 10^6$ m$^{-1}$, to thereby provide an MI element which is higher in the magnetic field detection sensitivity than the MR element and the GMR element, which can take the same magnetic field detection range as that of the conventional MR element, and which can obtain a stable sensitivity with a small element size (particularly, 2 mm or less). Also, in the MI element, if the operating point is set between the above-described magnetic fields Ht and 3Ht or between the magnetic fields −Ht and −3Ht, the magnetic field detection relatively excellent in linearity and high in sensitivity can be conducted.

As was apparent from the above description, according to this embodiment, in the MI element in which the element body is formed of the magnetic thin film in the zigzag pattern, influences of the thickness T of the magnetic thin film and the ratio of the zigzag pattern length L/(pattern line width W×film thickness T) on the characteristic of the element is investigated, and the respective optimum set ranges are made definite, thereby being capable of providing an MI element which is higher in the magnetic field detection sensitivity than the MR element and the GMR element, which can take the same magnetic field detection range as that of the conventional MR element, and which can obtain a stable sensitivity with a small element size. Also, in the MI element, the optimum range of the operating point due to the bias magnetic field is made definite, thereby being capable of detecting the magnetic field with a relatively high linearity and with a high sensitivity.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetic impedance element, comprising:

an element body formed of a magnetic thin film, said magnetic thin film formed on a non-magnetic substrate, wherein, when a high-frequency current is supplied to said magnetic thin film, an impedance between both ends of said magnetic thin film changes in accordance with an external magnetic field, wherein said magnetic thin film is formed in a slender zigzag pattern obtained by folding a straight line in parallel along a direction of magnetic field detection, and an easy axis of magnetization of said magnetic thin film is so set as to be directed along the longitudinal direction of said pattern, and wherein when a thickness of said magnetic thin film is T, a line width of said pattern is W, and a length of said pattern is L, T is in a range of 1 to 5 $\mu$m, and L/(W×T) is in a range of 10 to 400×10$^6$ m$^{-1}$.

2. A magnetic impedance element according to claim 1, wherein L/(W×T) is within the range of 28 to 100×10$^6$ m$^{-1}$.

* * * * *